(12) United States Patent
Vicard et al.

(10) Patent No.: US 10,707,363 B2
(45) Date of Patent: *Jul. 7, 2020

(54) ASSEMBLY FOR HOUSING WIRE ELEMENTS

(71) Applicant: COMMISSARIAT A L'ENERGIE ATOMIQUE ET AUX ENERGIES ALTERNATIVES, Paris (FR)

(72) Inventors: Dominique Vicard, Saint-Nazaire-les-Eymes (FR); Jean Brun, Champagnier (FR); Pierre Perichon, Voiron (FR)

(73) Assignee: COMMISSARIAL A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 269 days.

This patent is subject to a terminal disclaimer.

(21) Appl. No.: 14/798,856

(22) Filed: Jul. 14, 2015

(65) Prior Publication Data

US 2015/0318409 A1  Nov. 5, 2015

Related U.S. Application Data

(63) Continuation of application No. 13/515,149, filed as application No. PCT/FR2009/001462 on Dec. 18, 2009, now Pat. No. 9,112,079.

(30) Foreign Application Priority Data

Dec. 9, 2009  (FR) ...................................... 09 05964

(51) Int. Cl.
*H01L 31/05*  (2014.01)
*H01L 31/042*  (2014.01)
(Continued)

(52) U.S. Cl.
CPC ...... *H01L 31/042* (2013.01); *H01L 31/02008* (2013.01); *H01L 31/043* (2014.12);
(Continued)

(58) Field of Classification Search
CPC ......... H01L 31/02002; H01L 31/02013; H01L 31/048; H01L 31/0488; H01L 31/0504
See application file for complete search history.

(56) References Cited

U.S. PATENT DOCUMENTS 4,832,755 A * 5/1989 Barton .................. H01L 31/048
136/251
5,391,235 A  2/1995 Inoue
(Continued)

FOREIGN PATENT DOCUMENTS

EP  0385843 A1  9/1990
EP  0474349 A2  3/1992
(Continued)

OTHER PUBLICATIONS

Sep. 10, 2015 Search Report issued in European Application No. 98 804 279.9.
(Continued)

*Primary Examiner* — Bethany L Martin
(74) *Attorney, Agent, or Firm* — Oliff PLC

(57) ABSTRACT

The assembly has a central block that includes a first main face, a second main face and side faces. The second main face is opposite to the first main face, and the side faces connect the first main face to the second main face. The assembly also includes a first cover arranged on the first main face. The first main face and a first external surface of the first cover form a first groove for housing a first wire element, and the first groove extends along an entire length of the first main face. The assembly further includes a second cover arranged on the second main face. The second (Continued)

main face and a second external surface of the second cover form a second groove for housing a second wire element, and the second groove extends along an entire length of the second main face.

9 Claims, 8 Drawing Sheets

(51) Int. Cl.
  *H01L 31/048* (2014.01)
  *H01L 31/02* (2006.01)
  *H01L 31/043* (2014.01)

(52) U.S. Cl.
  CPC ........ *H01L 31/048* (2013.01); *H01L 31/0504* (2013.01); *Y02E 10/52* (2013.01)

(56) References Cited

U.S. PATENT DOCUMENTS

| | | | |
|---|---|---|---|
| 9,112,079 B2* | 8/2015 | Vicard | ............... H01L 31/048 136/244 |
| 2003/0006730 A1 | 1/2003 | Tachibana | |
| 2005/0056312 A1 | 3/2005 | Young et al. | |
| 2007/0227585 A1* | 10/2007 | Yoshimine | ............ H01L 31/048 136/251 |

FOREIGN PATENT DOCUMENTS

| | | |
|---|---|---|
| JP | S60-137448 U | 9/1985 |
| JP | H09-260707 A | 10/1997 |
| JP | 2002-246628 A | 8/2002 |
| JP | 2002-324596 A | 11/2002 |
| JP | 2008-135646 A | 6/2008 |

OTHER PUBLICATIONS

Oct. 22, 2013 Office Action issued in Japanese Application No. 2012-542590.

* cited by examiner

ASSEMBLY FOR HOUSING WIRE ELEMENTS

CROSS REFERENCE TO THE RELATED APPLICATIONS

This application is a continuation application of U.S. patent application Ser. No. 13/515,149, filed Jul. 25, 2012, which is a U.S. National Stage application claiming the benefit of prior filed International Application Number PCT/FR2009/001462, filed Dec. 18, 2009, in which the International Application claims a priority date of Dec. 9, 2009 based on prior filed French Application Number 09/05964, the entire contents of which are incorporated herein by reference.

TECHNICAL FIELD OF THE INVENTION

The invention relates to a photovoltaic cell provided with a block including at least one semiconductor substrate in which is formed at least one photovoltaic junction connected to a first electrical contact element with a first pole and to a second electrical contact element with a second pole.

STATE OF THE ART

Current photovoltaic panels comprise lines of solar cells electrically connected in series.

FIG. 1 represents three solar cells 1a, 1b, 1c connected in series. A cell comprises a semiconductor substrate 2a in which at least one junction PN is formed. A cell has usually the form of a square with a side of approximately 16 cm. The electrical contact elements are arranged on both sides of the substrate 2a. In FIG. 1, a first electrical contact element 3 with a negative pole is arranged on the face of each cell 1a, 1b, 1c designed to be oriented towards the sun. In order to increase the yield of a solar cell while letting photons through, the first electrical contact element 3 is constituted by an electrode provided on both sides of its longitudinal axis of combs. A second electrical contact element with a positive pole is formed by a metal layer 4 covering the back face of the cell. A series of solar cells is made by welding electrically conducting bands 5a, 5b, 5c between two adjacent cells. Thus, a first cell 1a is linked to a second cell 1b by a band 5b welded at one end to the metal layer 4 of the second cell 1b and at another end to the first electrical contact element 3 of the first cell 1a. The second cell 1b is connected to a third cell 1c by a band 5b welded at one end to the metal layer 4 of the third cell 1c and at another end to the first electrical contact element 3 of the second cell 1b. The step which consists in linking several cells together becomes increasingly difficult to carry out since current technologies tend to make cells thinner in order to save materials, in particular when they are made on silicon substrates.

Indeed, the rigid solar cells are to date mainly produced from increasingly fine silicon plates. Materials and manufacturing processes are the subject of research programs in order to reduce the production costs by diminishing the quantity of silicon per wafer. For that, the thickness of the silicon wafers has been first of all reduced from 300 µm to 200 µm, and it is now thought to reach a thickness of 180 µm, even 150 µm. As result of this reduction in thickness, the cells has become more and more fragile and their handling difficult.

Moreover, once the cells are connected together to form a panel, the panel is encapsulated within a massive framework in order to protect the whole. The final panel is often relatively thick.

In addition, making flexible solar panels requires in a general way the use of "flexible" semiconductor materials whose performance is lower than that of "rigid" semiconductor materials such as single-crystal silicon.

OBJECT OF THE INVENTION

The object of the invention consists in making a photovoltaic cell easy to conceive and to handle, while allowing to make flexible assemblies with low thicknesses.

This object is reached in that the cell comprises a first transparent cover arranged on a first face of the block and delimiting with said cell block a first groove for housing a first electrically conducting wire element.

According to one embodiment the cell comprises a second cover arranged on a second face of the block, opposite the first face of the block, and delimiting with the cell block a second groove for housing a second electrically conducting wire element.

According to an alternative, the second cover and/or first cover are placed directly on the semiconductor substrate.

According to another embodiment, at least one of the electrical contact elements connected to the photovoltaic junction comprises a wire element embedded in a groove.

According to another embodiment, at least one of the electrical contact elements comprises a plurality of conducting arms arranged on a face of the semiconductor substrate, said arms being designed to be in contact with or to be linked to a wire element.

According to another embodiment, as the second cover is transparent, the block comprises two semiconductor substrates including photovoltaic junctions separated by a metal layer, the cell comprising a third longitudinal groove for housing a third electrically conducting wire element designed to be connected to said metal layer.

According to another embodiment, the block comprises two semiconductor substrates including photovoltaic junctions separated by a dielectric, the cell comprising third and fourth grooves respectively formed on a side face at the interface between the dielectric layer and the associated semiconductor substrates.

Another object of the invention consists of an assembly of photovoltaic cells including several photovoltaic cells linked to one another by several wire elements, each wire element being embedded in the grooves of at least two photovoltaic cells.

Another object of the invention consists of a method for assembling a plurality of photovoltaic cells, each cell comprising first and second grooves formed on the same side face, the method comprises the following successive steps:

positioning cells in the form of at least one line so as to form a first and a second lines of grooves, the first groove of one cell being aligned with the second groove of the adjacent cell, wiring each line of cells, a first electrically conducting wire being inserted into each groove of the first line of grooves, and a second electrically conducting wire being inserted into each groove of the second line of grooves, alternatively cutting first and second wires between two adjacent cells, reversing every second photovoltaic cell in order to orient all the first covers of the photovoltaic cells towards the same side.

BRIEF DESCRIPTION OF THE DRAWINGS

Other advantages and characteristics will more clearly arise from the following description of particular embodiments of the invention given as nonrestrictive examples and represented in the annexed drawings in which.

DESCRIPTION OF PREFERENTIAL EMBODIMENTS

Figure 1:
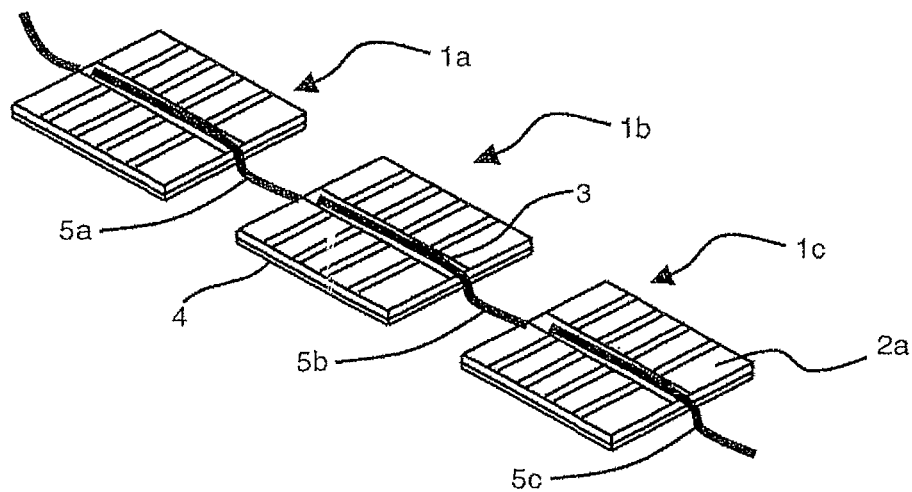
FIG. 1 illustrates three solar cells connected according to a known technique of the prior art.

In the embodiments illustrated in FIGS. 2 to 9, a photovoltaic cell is provided with a block 2 including at least one semiconductor substrate 2a in which at least one photovoltaic junction is formed. A photovoltaic junction can consist of a junction PN. Each photovoltaic junction is connected to a first electrical contact element with a first pole and to a second electrical contact element with a second pole. The photovoltaic cell comprises a first transparent cover 6a arranged on a first face of the block 2 and delimiting with the block 2 a first groove 7a for housing a first electrically conducting wire element.

Preferably, the first groove 7a is a longitudinal groove for housing the first wire element on a side face 8 of the cell.

The first and second poles correspond, for example, to an anode and a cathode. The first and second electrical contact elements allow the collection of the charges, electrons and holes of electrons, generated in the semiconductor substrate.

Figure 2:
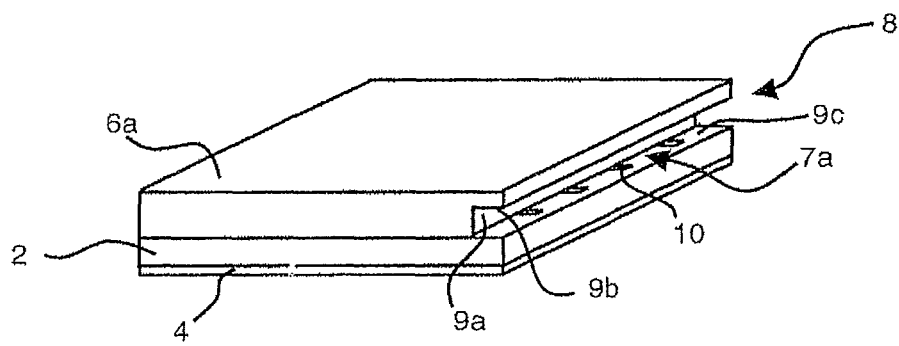
FIG. 2 illustrates a first embodiment of a photovoltaic cell according to the invention.

The cover 6a preferably comprises a shoulder at one of its longitudinal edges. The block 2 preferably has dimensions appreciably equal to the dimensions of the first cover 6a. Thus, when the first cover 6a is in position on the block 2 as illustrated in FIG. 2, and the face of the first cover 6a with a notch forming the shoulder is oriented towards the first face of the block 2, the first longitudinal groove 7a is naturally delimited. The first groove 7a is then made of a bottom 9a linked to two side walls 9b, 9c. The side wall 9b and the bottom 9a are delimited by the shoulder of the first cover 6a and the other side wall 9c is delimited by a free portion of the first face of the block 2.

The first wire element is preferably embedded longitudinally in the first groove 7a. By longitudinal embedding it is understood that the axis of the wire element is substantially parallel to the longitudinal axis of the groove in which it is embedded.

Figure 3:
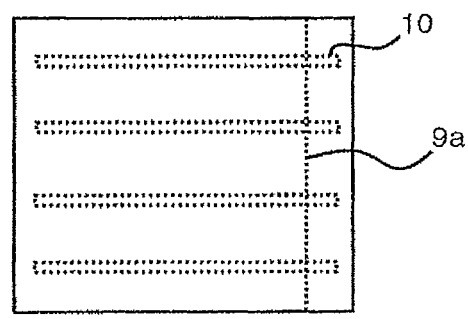
FIG. 3 illustrates a top view of the cell in FIG. 2.

According to a first particular embodiment illustrated in FIGS. 2 and 3, the block 2 is made up of only one semiconductor substrate and the first cover 6a can be placed directly on the semiconductor substrate. The first electrical contact element can comprise a plurality of conducting arms 10 arranged on a first face of the substrate. The second electrical contact element can comprise a metal layer 4 formed on a second face of the semiconductor substrate opposite the first face of the substrate. In other words, the metal layer 4 covers the semiconductor substrate. Preferably, the arms 10 are substantially perpendicular to a longitudinal axis of the first groove 7a, and are arranged between the first cover 6a and the first face of the substrate. Preferably, the arms are electrically connected to the groove by means of an electrically conducting connection arm (not represented) covering at least a part of the side wall 9c of the first groove 7a formed by the portion of substrate. The arms 10 are preferably placed at a distance to one another so as to optimize the active surface of the cell. In other words, at least one of the electrical contact elements comprises a plurality of conducting arms 10 arranged on a face of the semiconductor substrate, said arms 10 being designed to be in contact with or to be linked to a wire element.

The arms 10 and the connection arm can be made out of a metal or another conducting material deposited, or formed, on the substrate 2.

According to an alternative, the connection arm is not necessary, the arms 10 cover a part of the side wall 9c of the first groove 7a formed by the free portion of the semiconductor substrate. The arms 10 are electrically connected together when the first electrically conducting wire element is embedded longitudinally in the first groove 7a. When said first wire element is in electrical contact with the substrate, for example when the wire is made up of only one conducting material, said first wire element then constitutes a part of the first of contact element. In other words, at least one of the electrical contact elements connected to the photovoltaic junction comprises a wire element embedded in a groove.

According to another alternative, if the cell, and more particularly the semiconductor substrate, has dimensions lower than a minimal distance making it possible to attract a great number of electrons or holes of electrons generated by the absorption of photons, the arms 10 are then not essential. The first electrically conducting wire element, once it is longitudinally embedded in the first groove 7a, can alone act as the first electrical contact element.

An assembly of such cells in series with electrically conducting wire elements comprises, between each cell, a electrically wire element connecting the first groove 7a of a first cell to the metal layer 4 of a second cell.

Figure 4:
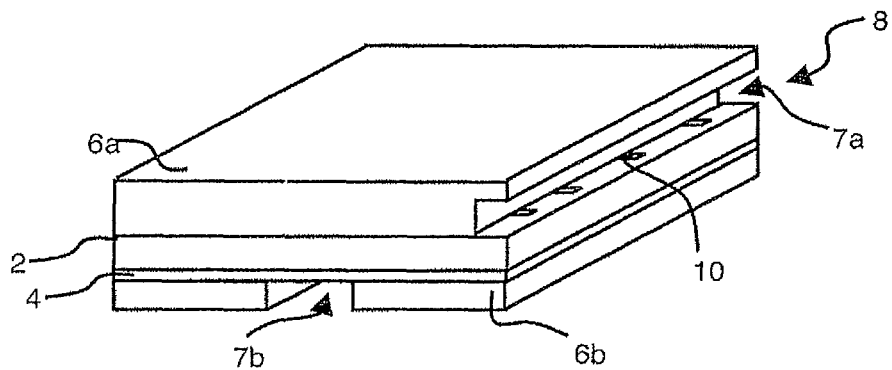
FIG. 4 illustrates an alternative of the first embodiment.

According to an alternative of the first embodiment illustrated in FIG. 4, the free face of the metal layer 4 is covered by a second cover 6b in the center of which a second groove 7b is made, preferably with a longitudinal axis substantially parallel to the longitudinal axis of the first groove 7a. This second groove 7b makes it possible to facilitate the assembly of a series of cells by delimiting a groove in which a second electrically conducting wire element can be inserted, for example by longitudinal embedding. As in FIG. 4, the cell can comprise a second cover 6b arranged on a second face of the block 2, opposite the first face of the block 2, and delimiting with the block 2 of the cell a second groove 7b for housing a second electrically conducting wire element.

Of course, if the cell has small dimensions, the metal layer can be removed and the second electrical contact element is then formed by the second electrically conducting wire element in contact with the substrate. In this case, only the second cover 6b remains to protect the semiconductor substrate.

According to another alternative not represented, the metal layer 4 is sufficiently thick to make the second groove 7b in the free face of this metal layer 4. The cover 6b is then not essential.

Figure 5:
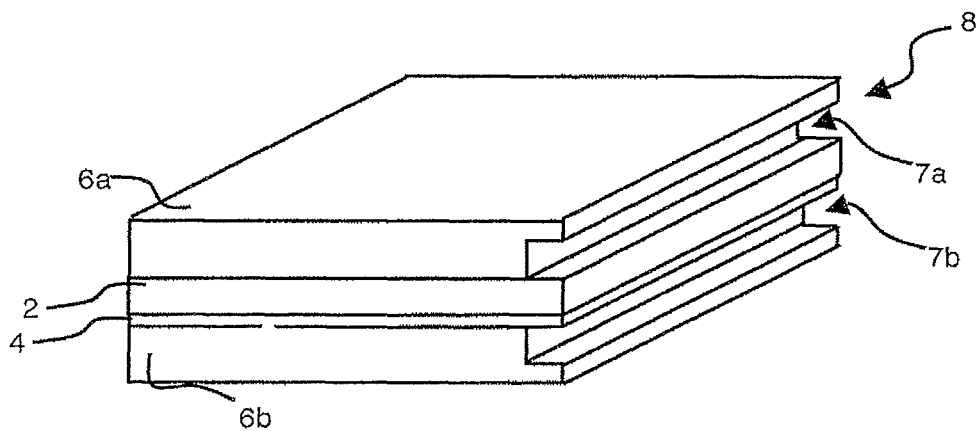
FIG. 5 illustrates a second embodiment of a cell according to the invention.

According to a second embodiment illustrated in FIG. 5 and in which the block 2 comprises a single semiconductor substrate provided with a photovoltaic junction, the cell comprises a second cover 6b arranged on a second face of the semiconductor substrate, opposite the first face of said substrate, and delimiting with the substrate, preferably in a side face 8 of the cell, a second longitudinal groove 7b for housing a second electrically conducting wire element. This second groove 7b is preferably substantially parallel to the first groove 7a, i.e. it has a longitudinal axis parallel to the longitudinal axis of the first groove 7a. The second groove 7b is preferably located in the same side face 8 as the first groove 7a to facilitate the method of assembling a plurality of cells, as it is described hereafter in relation to FIGS. 12 and 13. The first and second electrical contact elements can be totally or partly composed of at least the first and second wire elements respectively longitudinally embedded in the first 7a and second 7b grooves.

In FIG. 5, a metal layer 4 is preferably interposed between the semiconductor substrate and the second cover 6b in order to totally or partly form the second electrical contact element, said metal layer 4 being in electrical contact with the second wire element after its embedding into the second groove 7b. As described previously, the embodiment in FIG. 5 can also integrate arms arranged between the first cover 6a and the semiconductor substrate.

Figure 6:
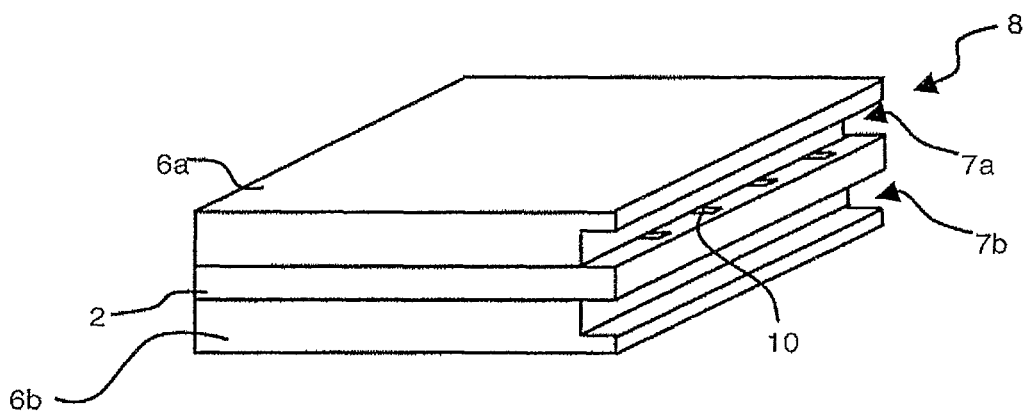
FIG. 6 illustrates an alternative of the second embodiment.

According to an alternative of the second embodiment illustrated in FIG. 6, the second cover 6b is transparent too. This makes it possible to collect charges produced by photons interacting in the semiconductor while going through the first cover 6a and/or the second cover 6b. Consequently the metal layer 4 can be replaced by arms, similar to the previously-described arms 10, and interposed between the second cover 6b and the semiconductor substrate. The conducting arms are, for example, perpendicular to a longitudinal axis of the second groove 7b. The conducting arms can be electrically connected together by a conducting connection arm. This connection arm is preferably placed under the future embedded wire element, i.e. on the side wall of the second groove 7b formed by the portion of substrate, in order not to increase the obstruction to photons induced by the presence of the conducting arms on the surface of the substrate and the presence of the future wire element.

As indicated previously, if the cell has small dimensions, the arms are not essential. The first and second electrically conducting wire elements, respectively longitudinally embedded in the first and second grooves 7a, 7b, can form alone the first and second electrical contact elements. Consequently, the first 6a and/or the second 6b covers can be placed directly on the semiconductor substrate.

Figure 7:
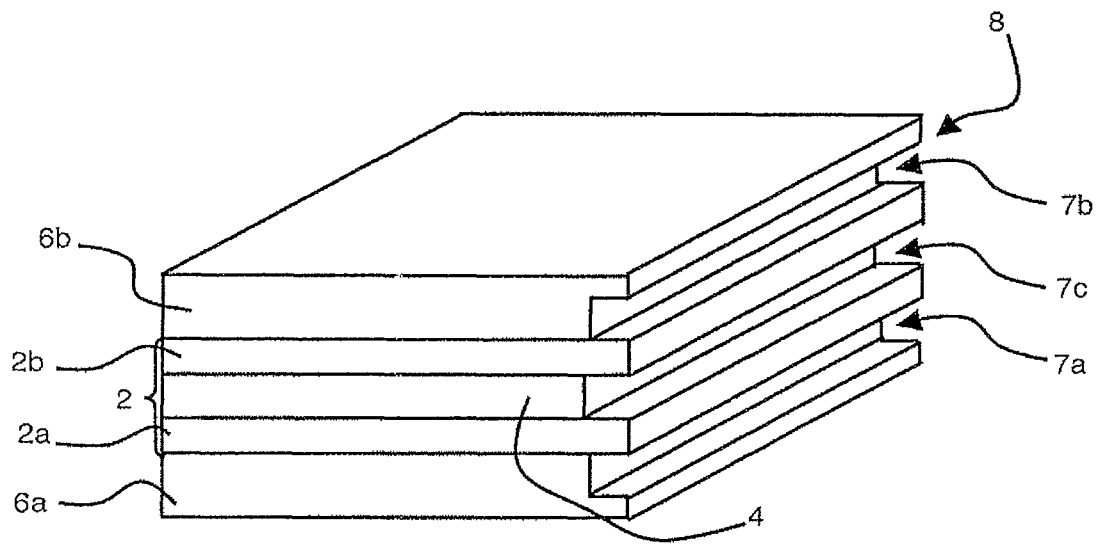
FIG. 7 illustrates a third embodiment of a photovoltaic cell provided with three grooves.

According to a third embodiment illustrated in FIG. 7, the cell includes a central block 2 sandwiched between two covers 6a, 6b. More precisely, the cell includes a stack composed of a first transparent cover 6a, of a first semiconductor substrate 2a provided with a first photovoltaic junction, of a metal layer 4, of a second semiconductor substrate 2b provided with a second photovoltaic junction, and of a second transparent cover 6b. The first cover 6a and the semiconductor substrate 2a delimit on a side face 8 of the cell a first longitudinal groove 7a for housing an electrically conducting wire element. The second cover 6b and the semiconductor substrate 2b delimit on a side face 8 of the cell a second longitudinal groove 7b for housing a second electrically conducting wire element. Moreover, the first 2a and second 2b semiconductor substrates are, in this example, larger than the metal layer 4 on the side of the side face 8. Thus, the metal layer 4 and the first and second substrates 2a, 2b delimit on the side face 8 of the cell a third longitudinal groove 7c for housing a third electrically conducting wire element designed to be linked to the metal layer 4. In other words, as the second cover 6b is transparent, the block 2 comprises two semiconductor substrates 2a, 2b including photovoltaic junctions separated by a metal layer 4, the cell moreover comprising a third longitudinal groove 7c for housing a third electrically conducting wire element designed to be linked to said metal layer 4. The third groove 7c comprises a longitudinal axis, preferably substantially parallel to the longitudinal axis of the first groove 7a. Preferably, the three grooves 7a, 7b, 7c are formed in the same side face 8 of the cell to facilitate its assembly with other cells. Such a cell can receive photons from the two main faces of the cell.

Preferably, conducting arms similar to those indicated for the embodiment illustrated in FIG. 6 are respectively interposed between the first cover 6a and the substrate 2a, and between the second cover 6b and the substrate 2b. Of course, if the cell has small dimensions, the arms are not essential.

In this embodiment (FIG. 7), the cell includes two photovoltaic junctions formed respectively in the semiconductor substrates 2a and 2b. Each photovoltaic junction is connected to a first and a second electrical contact element. The third wire element, placed in the third groove 7c, will be linked to a contact element of the upper photovoltaic junction (in the substrate 2b) and to a contact element of the lower photovoltaic junction (in the substrate 2a). According to the connections that will be carried out via the first, second and third wire elements embedded in the grooves of the cell, the two photovoltaic junctions can finally be mounted in series or in parallel.

According to an alternative, if the cell has small dimensions, the metal layer 4 can be replaced by a dielectric. The third groove 7c is then delimited by the dielectric and two opposite portions of the semiconductor substrates 2a and 2b. The wire element inserted in the third groove 7c forms a electrical contact element common to both photovoltaic junctions.

An assembly example for several cells such as those in FIG. 7 is described hereafter. It is used a Y-shaped electrically conducting wire element with two secondary arms connected to a main arm. The secondary arms are respectively inserted into the first and second grooves 7a, 7b of a cell. The main arm of the Y-shaped wire element will be embedded in the third groove 7c of an adjacent cell. The two photovoltaic junctions 2a, 2b of each cell are then mounted in parallel and the cell is equivalent to a single junction connected to common first and second poles.

In such an assembly, the Y-shaped wire element can be composed of two wires meeting at the third groove to form the main arm of the Y.

Figure 8:
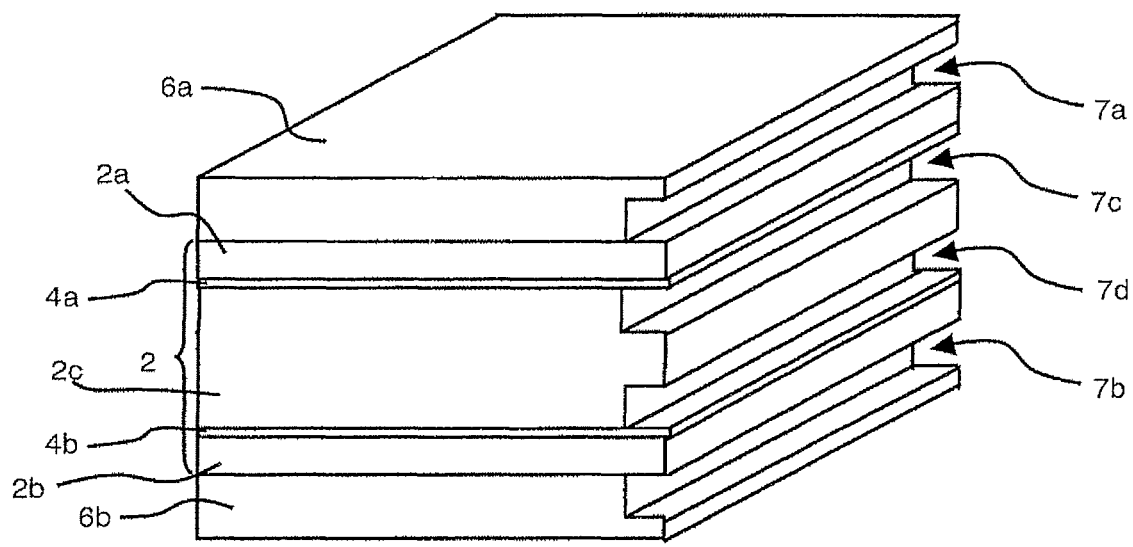
FIG. 8 illustrates a fourth embodiment of a photovoltaic cell according to the invention.

According to a fourth embodiment illustrated in FIG. 8, the cell always comprises first and second transparent covers 6a, 6b, each of them delimiting with a central block 2 a longitudinal groove for housing a wire element 7a, 7b. The block 2 comprises two semiconductor substrates 2a, 2b including photovoltaic junctions, separated by a dielectric 2c. A third longitudinal groove 7c and a fourth longitudinal groove 7d, preferably substantially parallel to the first groove 7a, are formed respectively at the interfaces between the dielectric layer 2c and the associated semiconductor substrates 2a, 2b. Preferably, the third 7c and fourth 7d grooves are made in the same side face of the cell as the first and second grooves 7a, 7b.

Moreover, the block 2 can comprise the metal layers 4a, 4b interposed between the semiconductor substrates 2a, 2b and the dielectric 2c on both sides of the dielectric 2c. The metal layers 4a, 4b enable to optimize the yield of a cell if its dimensions do not allow the wire elements to collect all the charges generated in the semiconductor substrates.

According to an alternative applicable to all the embodiments, each cover 6a, 6b can form a concentrator of the solar radiations towards the associated semiconductor substrate. This makes it possible to improve the yield of each photovoltaic cell. As a particular example, a transparent cover can comprise a plurality of lenses making the photons converge into the associated semiconductor substrate.

In a general way, the yield of the cell falls when the semiconductor heats. Thus, at least one of the covers can form a heat sink, while using, for example, a comb-shaped cover made out of a thermo-conducting material. For example, a concentrating transparent cover and a heat sink cover can be envisaged.

Figure 9:
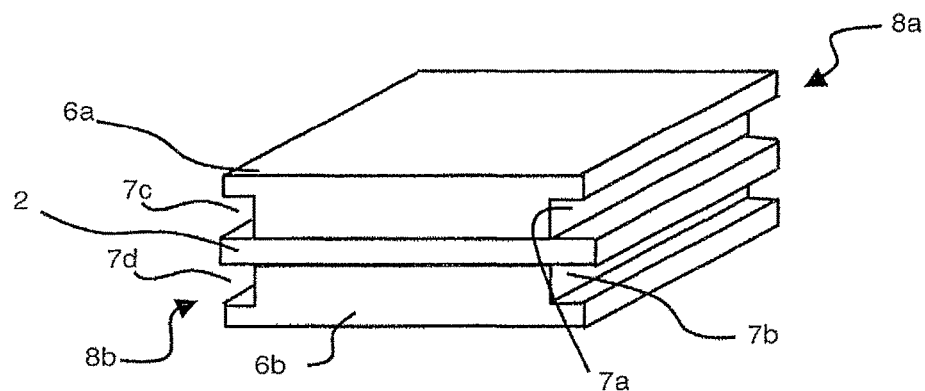
FIG. 9 illustrates a fifth embodiment of a photovoltaic cell according to the invention.

According to a fifth embodiment illustrated in FIG. 9, the cell is of the type of those illustrated in FIGS. 5 and 6, i.e. it comprises on a first side face 8a first and second grooves 7a, 7b. The cell in FIG. 9 moreover comprises on a second face side 8b, opposite and preferably parallel to the first side face 8a, longitudinal third and fourth grooves 7c, 7d for housing a wire element. These grooves 7c, 7d are preferably also delimited by a shoulder in the associated cover and by the semiconductor substrate. The assembly of two cells in series can be carried out by a first wire element inserted both in the first groove 7a of a first cell and in the second groove 7b of a second cell. In the same way a second wire element is inserted both in the third groove 7c of the first cell and in the fourth groove 7d of the second cell. This makes it possible to obtain a series of cells maintained on two opposite side faces thus improving the solidity of the assembly. Moreover, if one of the wire elements breaks, the second will still be able to ensure the continuity in the series of cells. According to the dimensions of the cells, these wire elements can be sufficient for forming the first and second electrical contact elements. If not, it is possible to form arms between each cover and the substrate as previously described. Of course, the person skilled in the art can adapt this principle to the embodiments in FIGS. 7 and 8.

Thanks to such cells, the semiconductor substrate is protected from the external environment by the two covers 6a, 6b or by the first transparent cover 6a and the metal layer 4 formed under the cell. Thus, contrary to the methods for assembling traditional photovoltaic cells, it is not necessary to assemble the various photovoltaic cells according to the invention in a specific environment with few dust (in order to avoid the contamination of the semiconductor substrates).

Moreover, the covers 6a, 6b give a certain rigidity to the whole, and allow an easier handling of the cells during the assembly. As an example, the thickness of the semiconductor substrate is about 200 µm and each cover has a thickness of 200 µm.

A plurality of cells as described can be assembled in order to form a flexible photovoltaic panel, being able to be incorporated into a fabric. The flexibility of the panel is made possible by the use of a plurality of cells of small size, preferably with a side lower than 5 mm.

In a general way, an assembly of photovoltaic cells comprises several photovoltaic cells connected to one another by several wire elements, each wire element being embedded in the grooves of at least two photovoltaic cells.

Moreover, the assembling method according to the present invention makes it possible to make photovoltaic panels of very small dimensions comprising some cells of small size.

In the particular case when the cells are able to collect the solar radiations on both sides (by two transparent caps), an assembly of such cells comprises a first face designed to be oriented towards the sun. Reflecting means can be arranged on the second face of the assembly. Indeed, when the first face is oriented towards the solar radiations, a part of the solar radiations goes between the cells and is not absorbed via the first face. The reflecting means then make it possible to collect these radiations and to give them back towards the transparent covers of the second face. Such means can be formed, for example, by an aluminum or silver foil, patterned or not.

Figure 10:
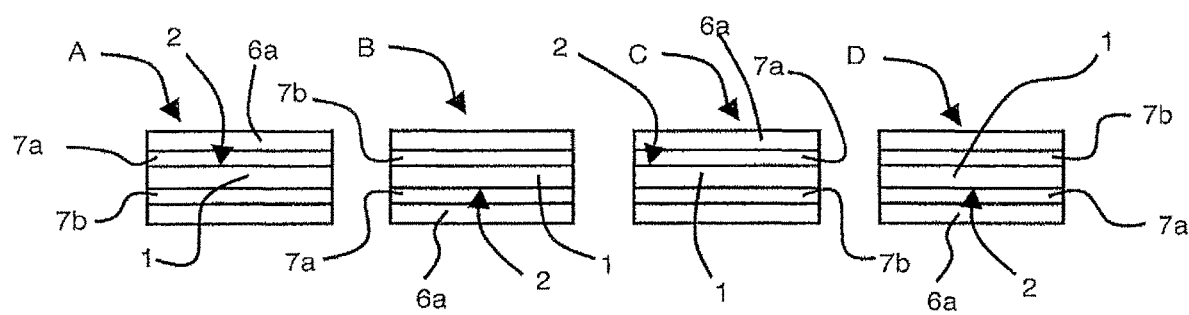
FIGS. 10 to 16 illustrate a method for assembling a plurality of photovoltaic cells in the form of a line.
Figure 11:
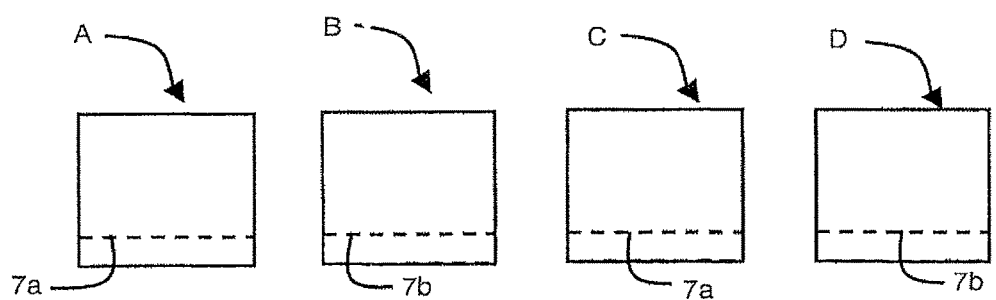

According to a particular embodiment example of a assembly using cells comprising in the same side face two longitudinal grooves for housing wire elements, illustrated in FIGS. 10 and 11, the cells are first of all positioned in the form of at least one line so as to form first and second rows of grooves. The cells are arranged so that the first groove 7a of a cell is aligned with the second groove 7b of the adjacent cell. As illustrated in FIG. 11, the cells have preferably the same size and form.

The particular example illustrates four cells A, B, C, D, each of them comprising two longitudinal grooves 7a, 7b on a side face of the photovoltaic cell. In FIG. 10, the cell A and the cell C have their first transparent cover 6a oriented towards the top, while the cells B and D have their first transparent cover 6a directed downwards. This is why the first row of grooves (top row in FIG. 10) is composed (from left to right) of the first groove 7a of the photovoltaic cell A, the second groove 7b of the photovoltaic cell B, of the first groove 7a of the photovoltaic cell C and of the second groove 7b of the photovoltaic cell D. In the same way, the second row of grooves (bottom row in FIG. 10) is composed (from left to right) of the second groove 7b of the photovoltaic cell A, of the first groove 7a of the photovoltaic cell B, of the second groove 7b of the photovoltaic cell C and of the first groove 7a of the photovoltaic cell D.

Figure 12:
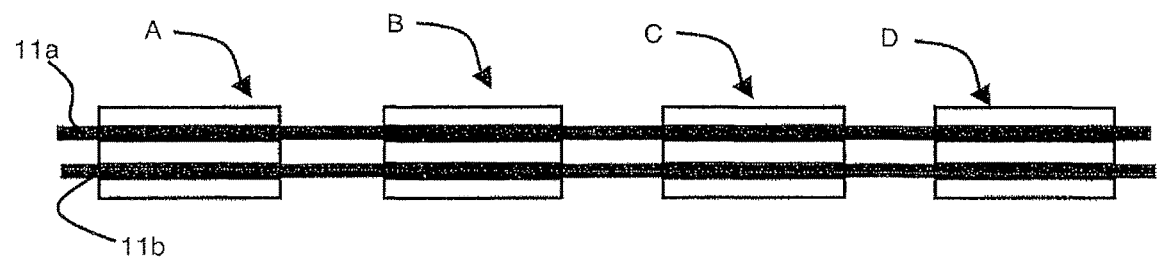
Figure 13:
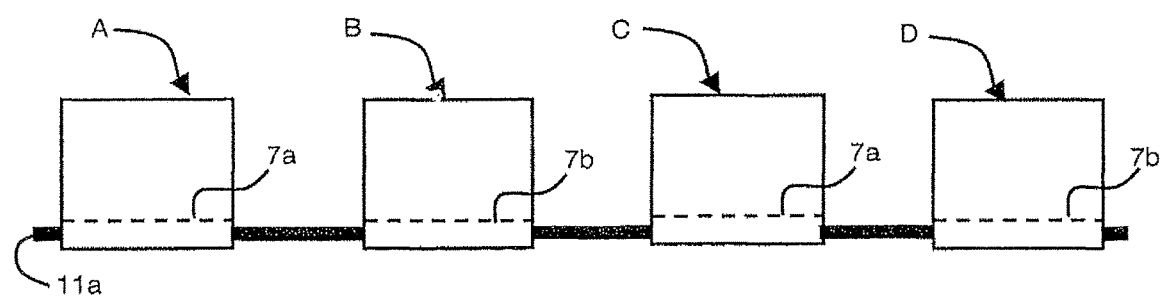

After positioning the cells suitably, these cells are wired on each line as illustrated in FIGS. 12 and 13. A first electrically conducting wire 11a is inserted in each groove of the first row of grooves (top grooves in FIG. 12), and a second electrically conducting wire 11b is inserted in each groove of the second row of grooves (bottom grooves in FIG. 12). Thus, in the particular example, the first wire 11a extends in the first groove 7a of the cell A, the second groove 7b of the cell B, the first groove 7a of the cell C and the second groove 7b of the cell D whereas the second wire 11b extends in the second groove 7b of the cell A, the first groove 7a of the cell B, the second groove 7b of the cell C and the first groove 7a of the cell D. Then, the first and second wires 11a and 11b are alternatively sectioned between two adjacent cells (FIG. 14) in order to form the first and second wire elements of each cell. In fact, the first wire element of a cell forms also the second wire element of the adjacent cell. The first and second wires 11a, 11b must be good conductors with low ohmic losses. As an example, it will be used wires out of copper or containing an alloy of silver and copper.

Figure 14:
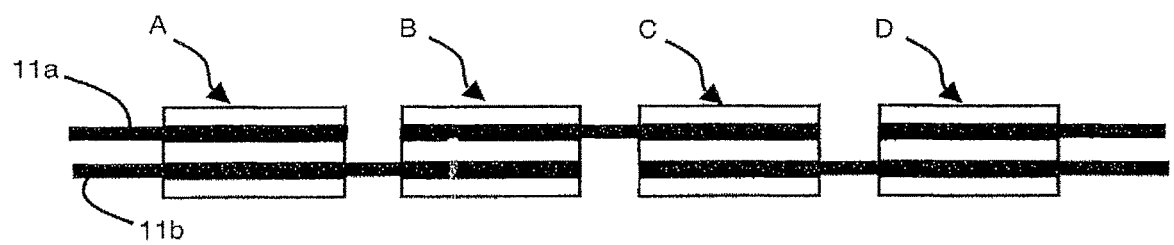

During sectioning, as the particular example in FIG. 14 illustrates it, the first wire 11a in the grooves in the upper part in FIG. 12 is sectioned between the cells A and B, and between the cells C and D. The second wire 11b in the low grooves is sectioned between the cells B and C. Finally, two adjacent cells are linked by a single segment of wire forming both the first wire element of a cell and the second wire element of the adjacent cell. The cell A is connected to the cell B by a segment of the second wire 11b, the cell B being connected to the cell C by a segment of the first wire 11a and the cell C being connected to the cell D by a segment of the second wire 11b.

Preferably, in order to avoid any short-circuit, when a wire 11a, 11b is sectioned between two adjacent cells, it is cut at the groove of said two adjacent cells as in FIG. 14.

After suitably sectioning the first and second wires 11a, 11b, every second photovoltaic cell is turned over (FIG. 15) in order to orient all the first covers of the cells on the same side. By turning over it is understood that the cell carries out a rotation of 180° relative to its initial position along an axis parallel to the first and second wires 11a and 11b.

Figure 15:
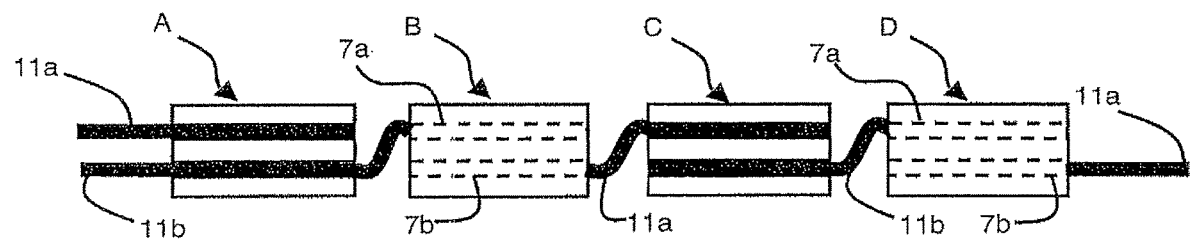
Figure 16:
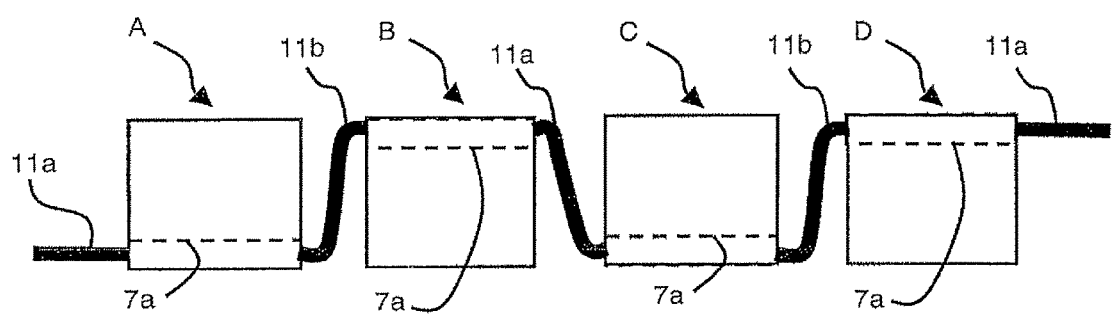

FIGS. 15 and 16 illustrate respectively in a side view and a top view the configuration of the cells after the turning-over step. The position of the cells A and C remains unchanged whereas the position of the cells B and D is reversed. In this configuration, the first covers 6a of each cell are oriented upwards and all the grooves 7a are then located in the upper part of the line of cells.

Figure 17:
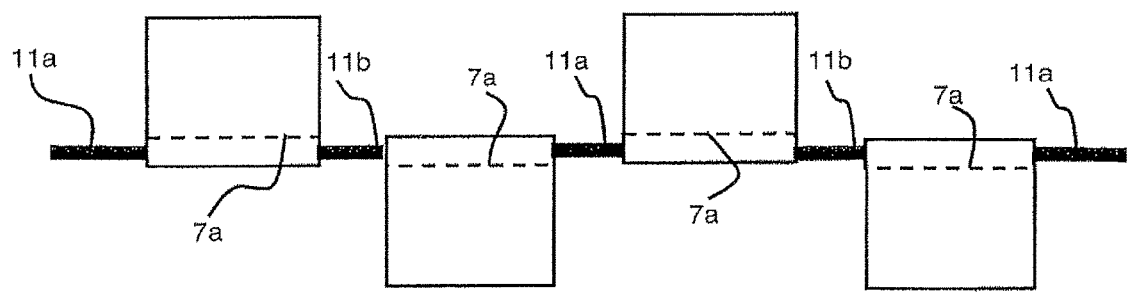
FIG. 17 illustrates an implementation alternative of the method for assembling a plurality of photovoltaic cells.

According to an alternative, after the photovoltaic cells are turned over, each line of cells is then stretched to allow the cells of the same line to be alternatively arranged on both sides of a central axis of the line of cells, as illustrated in FIG. 17.

This methods enables to connect in series photovoltaic cells as described in a simplified way and to obtain a flexible assembly.

The yield of a plurality of lines of photovoltaic cells in series can be improved by making an assembly in the form of a matrix. Thus, in an alternative, the assembling method comprises the making of a plurality of identical lines of cells. After the turning-over step, and preferably after the stretching step, the lines are arranged so as to form a matrix of lines and columns of cells as in FIG. 18. Two columns of adjacent cells are separated by an interval. Then, at each interval, a third wire electrically connects the conducting wire elements connecting two adjacent cells of each line of the matrix at this interval.

Figure 18:
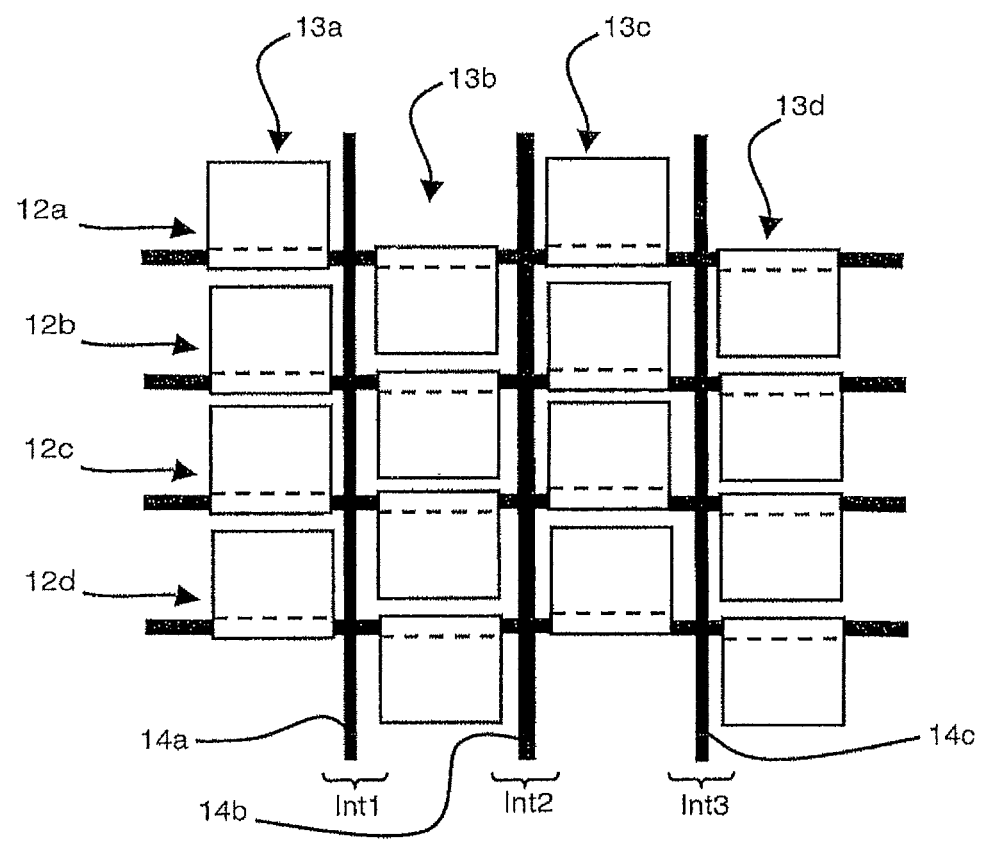
FIG. 18 illustrates a plurality of photovoltaic cells arranged in the form of matrix.

According to the particular example in FIG. 18, the matrix comprises four lines 12a, 12b, 12c, 12d arranged so as to form four columns of cells 13a, 13b, 13c, 13d. The first and second columns 13a, 13b, the second and third columns 13b, 13c, and the third and fourth columns 13c, 13d are each separated from one another by a respective interval Int1, Int2, Int3. At each interval, a third wire 14a, 14b, 14c, is arranged and electrically connected to each line of cells. This electric connection can be carried out by welding the third wire to each segment of wire element linking two adjacent cells of the same line in this interval. Thus, in FIG. 18, each line corresponding to a line in FIG. 17, the wire 14a links in the interval Int1 the wire elements of each line together, the wire 14b links in the interval Int2 the wire elements 11a of each line together and the wire 14c connects in the interval Int3 the wire elements 11b of each line together.

In order to limit the losses of performance when one or several cells are shaded, it is possible to use bypass diodes on one or more solar cells. In practice, a photovoltaic cell can be regarded as a current generator in parallel with a diode (formed by the photovoltaic junction of the solar cell), the intensity of the current depending on the incidental illumination of the cell. When the cell is shaded, the current is very low even zero. On a line of photovoltaic cells in series, if a cell is shaded, the current generated by the line of cells cannot circulate in it and the production of current becomes very low or zero. A bypass diode makes it possible to form a derivation of the current in order to limit the impacts of a cell which would be shaded or which could have a defect of design limiting its yield. Several modes of insertion of bypass diodes on an assembly of photovoltaic cells according to the present invention can be considered by the man skilled in the art.

In the case, for example, of an assembly such as that illustrated in FIG. 18, it is possible to add an additional line of bypass diodes, so that each additional diode of this additional line is connected in parallel to all the photovoltaic cells of a column. More precisely, the anode and the cathode of each additional diode are respectively connected to the cathodes and the anodes of the diodes formed by the photovoltaic junctions of the photovoltaic cells of a column. Each of such additional diodes can be made in the form of a microchip having two grooves provided with conducting studs respectively connected to the anode and the cathode of a diode of the respective microchip. The additional diodes can then be connected to one another and to the photovoltaic cells of the assembly according to a method for assembling identical to that described above. Preferably, the dimensions of such microchips are substantially the same as those of the photovoltaic cells of the assembly in order to guarantee a good integration of those into the assembly.

As a particular embodiment example, the diodes used are Schottky diodes. These diodes have the advantage of having a very low voltage drop (approximately 0.3 V) limiting the current consumed by the by-pass.

Such a method makes it possible to manufacture flexible and resilient panels in the form of a matrix of cells. Thus, the panel will be less impacted by zones of shades or at the time of a failure of one of the cells. The best tolerance of this panel allow it to obtain performance increased during its use on nonplane surfaces. As an example, the panel can be integrated into a garment or a backpack, it then makes it possible to store energy for supplying electronics equipments or to recharge batteries. This integration into textiles is not easily to achieve today. Indeed, an existing basic cell on a rigid support has a dimension of approximately 16 cm×16 cm. However, thanks to the assembling method as described, it is possible to obtain from a basic cell about 1024 photovoltaic cells having substantially a square with a side of 5 mm. It is then possible to connect these elements in order to form a matrix of thirty-two lines and thirty-two columns. By using flexible wire elements, it is finally obtained a square with a side of approximately 16 cm with a certain flexibility, which is suitable for its integration into a textile.

The assembly obtained can finally be embedded into a flexible adhesive or encapsulated between two photon transparent layers of flexible plastic. This makes it possible both to protect the components by ensuring a protection against corrosion and water, to keep the flexibility of the assembly, and to avoid the short-circuits between wire when the assembly is stressed.

An example of a method for manufacturing a plurality of photovoltaic cells, such as those illustrated in FIGS. 2 to 9, is illustrated in FIGS. 19 to 22. In a first step, a plurality of active zones 16 are made on an active plate 15. Each active zone 16 comprises at least one photovoltaic junction made out of a semiconductor material. Such a plate can have the form of a silicon wafer on which a plurality of active zones 16 provided with a photovoltaic junction are made.

Figure 19:
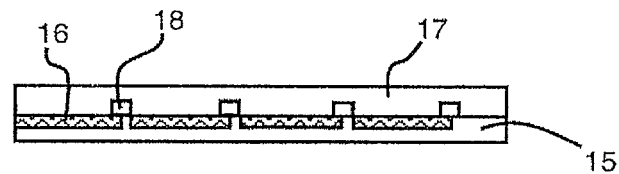
FIGS. 19 to 22 illustrate an example of a method for manufacturing photovoltaic cells.
Figure 20:
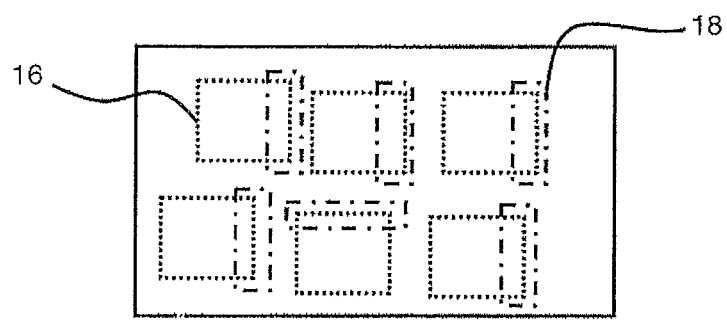

Then, a back plate 17 made out of a transparent material, for example glass, can be transferred onto the active plate 15 to form an assembly. This back plate 17 comprises cavities 18 arranged so that, for each active zone 16 of the active plate 15, a cavity 18 is placed facing one of the edges of said active zone (FIGS. 19 and 20). In FIG. 20, as the active zones 16 are arranged in an unordered way, the cavities 18 are consequently made in the back plate 17.

Figure 21:

Lastly, the assembly is cut out along the edges of the various active zones 16 for forming the cells. The cutting path goes through each cavity to obtain, after cutting, a plurality of cells each comprising at least one lateral groove (FIG. 21).

Figure 22:
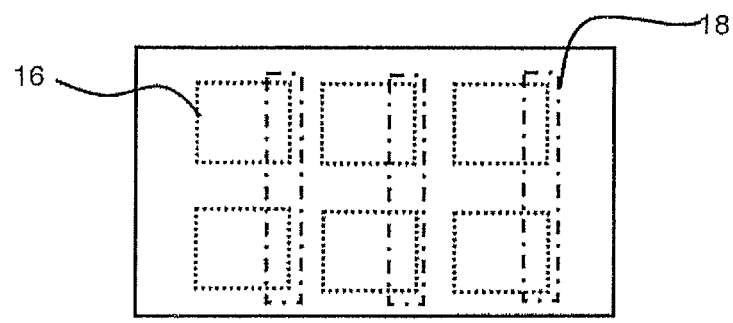

Preferably, the active zones form a grid as illustrated in FIG. 22 for optimizing the number of active zones made on the active plate. Thus, the cavities 18 of the back plate 17 can be made by a plurality of substantially parallel trenches facilitating the cutting of the assembly.

According to an alternative embodiment of the method, the active plate 15 is covered with an active layer and the cavities 18 of the back plate can be made by a plurality of substantially parallel trenches facilitating the cutting of the assembly. Indeed, the active zone can be a simple PN junction, it is then not necessary to first delimit active zones for each cell.

In order to make photovoltaic cells with two caps, it is possible, before cutting said assembly, to add a second back plate onto the back face of the active plate 15. The back plate on the back face preferably includes cavities, or openings, designed to form after cutting the assembly grooves for housing a wire element respectively placed on a side face or the back face of a cell.

According to a manufacture alternative, the active plate 15 can be thinned by its back face in order to make cells with a low thickness. In the same way, if the active plate 15 includes a metal layer, the metal layer can be thinned.

Once the back plate 17 is integral with the active plate 15, the active plate 15 can be thinned so as to let the active zones 16 flush before the transfer of another back plate onto the back face of the active plate 15. In particular, this enables to make a cell such as illustrated in FIG. 6, i.e. with two transparent caps.

Other embodiments of a photovoltaic cell according to the invention as well as other methods for assembling photovoltaic cells can be imagined by the man skilled in the art. Thus, although in the previously-described examples of cells the covers are placed directly on semiconductor substrates, it is possible to place the covers onto another constitutive layer of the central block. Moreover, one or more grooves for housing a wire element can be made on any face of the photovoltaic cell, for example on the front face of the photovoltaic cell through the transparent cover covering the block of the cell.

The invention claimed is:

1. An assembly comprising at least first and second devices, each device comprising:
   a first external main face opposite a second external main face connected by a first external side face opposite a second external side face, the main faces being orthogonal to the side faces;
   a first cover;
   a second cover;
   a block including at least a semiconductor substrate, the block being in contact with the first cover and the second cover, the block separating the first cover and the second cover;
   a first electrical contact element on a first main face of the semiconductor substrate;
   a second electrical contact element connected to a second main face of the semiconductor substrate;
   a first groove in an external face of the device extending along the entire length of one of the external main faces in a direction from the first external side face to the second external side face, said first groove comprising a bottom and two sidewalls, one of the sidewalls and the bottom being formed by the first cover and the other sidewall being formed by the block, the first electrical contact element being located on the other sidewall; and
   a second groove in an external face of the device extending along the entire length of one of the external main faces in the direction from the first external side face to the second external side face, said second groove comprising a bottom and two side walls, one of the side walls and the bottom being formed by a second cover and the other sidewall being formed by the block, the second electrical contact element being located on the other sidewall,
   wherein a first electrically conducting wire element is embedded in one of the first and second grooves of the first device and in one the first and second grooves of the second device, the first electrically conducting wire element protruding from the first external side face of the first device and protruding from the second external side face of the second device, the first device being mobile with respect to the second device.

2. The assembly according to claim 1, further comprising:
   a second wire element embedded in the other of the first and second grooves of the first device, the second wire element extending along a second longitudinal direction parallel to a longitudinal direction of the second groove, the second electrically conducting wire element protruding from the first external side face or the second external side face of the first device.

3. The assembly according to claim 2, wherein the first groove and the second groove are formed on a same external side face of the first device.

4. The assembly according to claim 2, wherein the first wire element is embedded in the first groove of the first device and in the first groove of the second device and the second wire element is embedded in the second groove of the first device and in the second groove of the second device.

5. The assembly according to claim 1, wherein the first cover comprises a plurality of lenses designed to converge photons into the semiconductor substrate, the semiconductor substrate comprising a photovoltaic junction.

6. The assembly according to claim 1, wherein the first device and the second device comprise a pair of first grooves formed on two opposite external faces and a pair of second grooves formed on said two opposite external faces, a pair of first wire elements being embedded in the pair of first grooves and a pair of second wire elements being embedded in the pair of second grooves.

7. The assembly according to claim 1, wherein the first electrically conducting wire element protrudes from the first and second external side faces of the first device and from the second external side face of the second device.

8. The assembly according to claim 2, wherein the second cover comprise a second semiconductor substrate and a third groove in an external face of the device extending along the entire length of one of the external main faces in a direction from the first external side face to the second external side face, said third groove comprising a bottom and two sidewalls, one of the sidewalls being formed by the second semiconductor substrate, the second semiconductor substrate being separated from the semiconductor substrate by a dielectric layer.

9. The assembly according to claim 8, wherein the two sidewalls of the second groove are respectively formed by the block and the second semiconductor substrate.

* * * * *